United States Patent
Yoon et al.

(10) Patent No.: US 10,756,238 B2
(45) Date of Patent: Aug. 25, 2020

(54) SEMICONDUCTOR LIGHT EMITTING DEVICE

(71) Applicant: Samsung Electronics Co., Ltd., Suwon-si, Gyeonggi-do (KR)

(72) Inventors: Ju Heon Yoon, Seoul (KR); Gi Bum Kim, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/234,800

(22) Filed: Dec. 28, 2018

(65) Prior Publication Data
US 2019/0334061 A1 Oct. 31, 2019

(30) Foreign Application Priority Data

Apr. 27, 2018 (KR) .................. 10-2018-0048855

(51) Int. Cl.
| | | |
|---|---|---|
| *H01L 33/44* | (2010.01) | |
| *H01L 33/38* | (2010.01) | |
| *H01L 33/20* | (2010.01) | |
| *H01L 33/40* | (2010.01) | |

(Continued)

(52) U.S. Cl.
CPC ............. *H01L 33/44* (2013.01); *H01L 33/20* (2013.01); *H01L 33/382* (2013.01); *H01L 33/405* (2013.01); *H01L 33/42* (2013.01); *H01L 33/32* (2013.01); *H01L 2933/0016* (2013.01); *H01L 2933/0025* (2013.01)

(58) Field of Classification Search
CPC ....... H01L 33/44; H01L 33/42; H01L 33/405; H01L 33/20; H01L 33/382; H01L 2933/0016; H01L 2933/0025; H01L 33/32; H01L 33/46; H01L 33/465
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| | | |
|---|---|---|
| KR | 10-2011-0121176 A | 11/2011 |
| KR | 10-2015-0091922 A | 8/2015 |

*Primary Examiner* — Bitew A Dinke
(74) *Attorney, Agent, or Firm* — Lee IP Law, P.C.

(57) ABSTRACT

A semiconductor light emitting device includes a light emitting structure having a first conductivity-type semiconductor layer, an active layer, and a second conductivity-type semiconductor layer, a transparent electrode layer on the second conductivity-type semiconductor layer, and a reflective electrode structure on the transparent electrode layer that includes a light-transmitting insulating layer on the transparent electrode layer with insulating patterns, portions of sides of the insulating patterns being open, and a contact region of the transparent electrode layer being defined by a region between the insulating patterns, air gaps between the transparent electrode layer and the insulating patterns, the air gaps extending in the open portions of the sides of the insulating patterns, and a reflective electrode layer on the insulating patterns to cover the open portions of the insulating patterns, the reflective electrode layer being connected to the contact region of the transparent electrode layer.

20 Claims, 14 Drawing Sheets

(51) Int. Cl.
*H01L 33/42* (2010.01)
*H01L 33/32* (2010.01)

(56) References Cited

U.S. PATENT DOCUMENTS

| | | | |
|---|---|---|---|
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,294,864 B2 | 11/2007 | Kim et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,685,588 B2 | 6/2017 | Liao et al. | |
| 9,691,943 B2 | 6/2017 | Hsieh et al. | |
| 2009/0212694 A1* | 8/2009 | Cok | H01L 51/5265 313/506 |
| 2010/0133505 A1* | 6/2010 | Takao | H01L 33/0079 257/13 |
| 2010/0219436 A1* | 9/2010 | Watanabe | H01L 33/0079 257/98 |
| 2013/0049050 A1* | 2/2013 | Weng | H01L 33/44 257/98 |
| 2013/0049053 A1* | 2/2013 | Kususe | H01L 33/38 257/98 |
| 2013/0113005 A1 | 5/2013 | Lee et al. | |
| 2014/0166975 A1* | 6/2014 | Ito | H01L 33/22 257/13 |
| 2014/0225143 A1* | 8/2014 | Kususe | H01L 24/96 257/98 |
| 2014/0348196 A1* | 11/2014 | Yoshinaga | H01S 5/3401 372/45.01 |
| 2014/0361682 A1* | 12/2014 | Cho | H05B 33/02 313/509 |
| 2015/0280071 A1* | 10/2015 | Takenaga | H01L 33/382 257/99 |
| 2016/0149085 A1* | 5/2016 | Kashimoto | H01L 33/385 438/47 |
| 2017/0222071 A1* | 8/2017 | Ji | H01L 31/022441 |
| 2017/0331009 A1* | 11/2017 | Shioji | H01L 33/507 |
| 2017/0365745 A1* | 12/2017 | Yang | H01L 33/36 |
| 2017/0373226 A1* | 12/2017 | Chen | F21V 29/77 |
| 2018/0130924 A1* | 5/2018 | Ko | H01L 33/0079 |
| 2018/0138372 A1* | 5/2018 | Kim | H01L 33/32 |
| 2019/0229242 A1* | 7/2019 | Yoon | H01L 33/42 |
| 2019/0273185 A1* | 9/2019 | Yoon | H01L 33/405 |

* cited by examiner

SEMICONDUCTOR LIGHT EMITTING DEVICE

CROSS-REFERENCE TO RELATED APPLICATION

Korean Patent Application No. 10-2018-0048855 filed on Apr. 27, 2018 in the Korean Intellectual Property Office, and entitled: "Semiconductor Light Emitting Device," is incorporated by reference herein in its entirety.

BACKGROUND

1. Field

The present disclosure relates to a semiconductor light emitting device.

2. Description of the Related Art

Semiconductor light emitting devices have been known as next generation light sources having many positive attributes, e.g., relatively long lifespans, low power consumption, rapid response rates, environmentally friendly characteristics, and the like, as compared to light sources according to the related art. Semiconductor light emitting devices have been used as important light sources in various products, e.g., lighting devices, backlight units of display devices, and the like.

SUMMARY

According to an example embodiment, a semiconductor light emitting device includes a light emitting structure including a first conductivity-type semiconductor layer, an active layer, and a second conductivity-type semiconductor layer, a transparent electrode layer on the second conductivity-type semiconductor layer, and a reflective electrode structure on the transparent electrode layer, the reflective electrode structure including a light-transmitting insulating layer on the transparent electrode layer and including a plurality of insulating patterns, portions of sides of the plurality of insulating patterns being open, and a contact region of the transparent electrode layer being defined by a region between the plurality of insulating patterns, a plurality of air gaps between the transparent electrode layer and the plurality of insulating patterns, respectively, the plurality of air gaps extending in the open portions of the sides of the plurality of insulating patterns, and a reflective electrode layer on the plurality of insulating patterns to cover the open portions of the sides of the plurality of insulating patterns, the reflective electrode layer being connected to the contact region of the transparent electrode layer.

According to an example embodiment, a semiconductor light emitting device includes a light emitting structure including a first conductivity-type semiconductor layer, an active layer, and a second conductivity-type semiconductor layer, a transparent electrode layer on the second conductivity-type semiconductor layer, a light-transmitting insulating layer including a plurality of insulating patterns on the transparent electrode layer, a plurality of air gaps being defined between the transparent electrode layer and the plurality of insulating patterns, respectively, and a contact region of the transparent electrode layer being defined by a region between the plurality of insulating patterns, a reflective electrode layer on the transparent electrode layer to cover the plurality of insulating patterns, and connected to the contact region of the transparent electrode layer, a first insulating layer on the reflective electrode layer, and having at least one opening connected to the reflective electrode layer, and a connection electrode on the first insulating layer, and connected to the reflective electrode layer through the at least one opening.

According to an example embodiment, a semiconductor light emitting device includes a light emitting structure including a first conductivity-type semiconductor layer, an active layer, and a second conductivity-type semiconductor layer, a transparent electrode layer on the second conductivity-type semiconductor layer, a base insulating layer and a light-transmitting insulating layer sequentially positioned on the transparent electrode layer, and having a plurality of openings connected to the transparent electrode layer, and a reflective electrode layer on the light-transmitting insulating layer, and connected to the transparent electrode layer through the plurality of openings, wherein the light-transmitting insulating layer is spaced farther apart from the plurality of openings than the base insulating layer, such that an air gap is defined between the light-transmitting insulating layer and the transparent electrode layer.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be described in detail with reference to the accompanying drawings.

Figure 1:
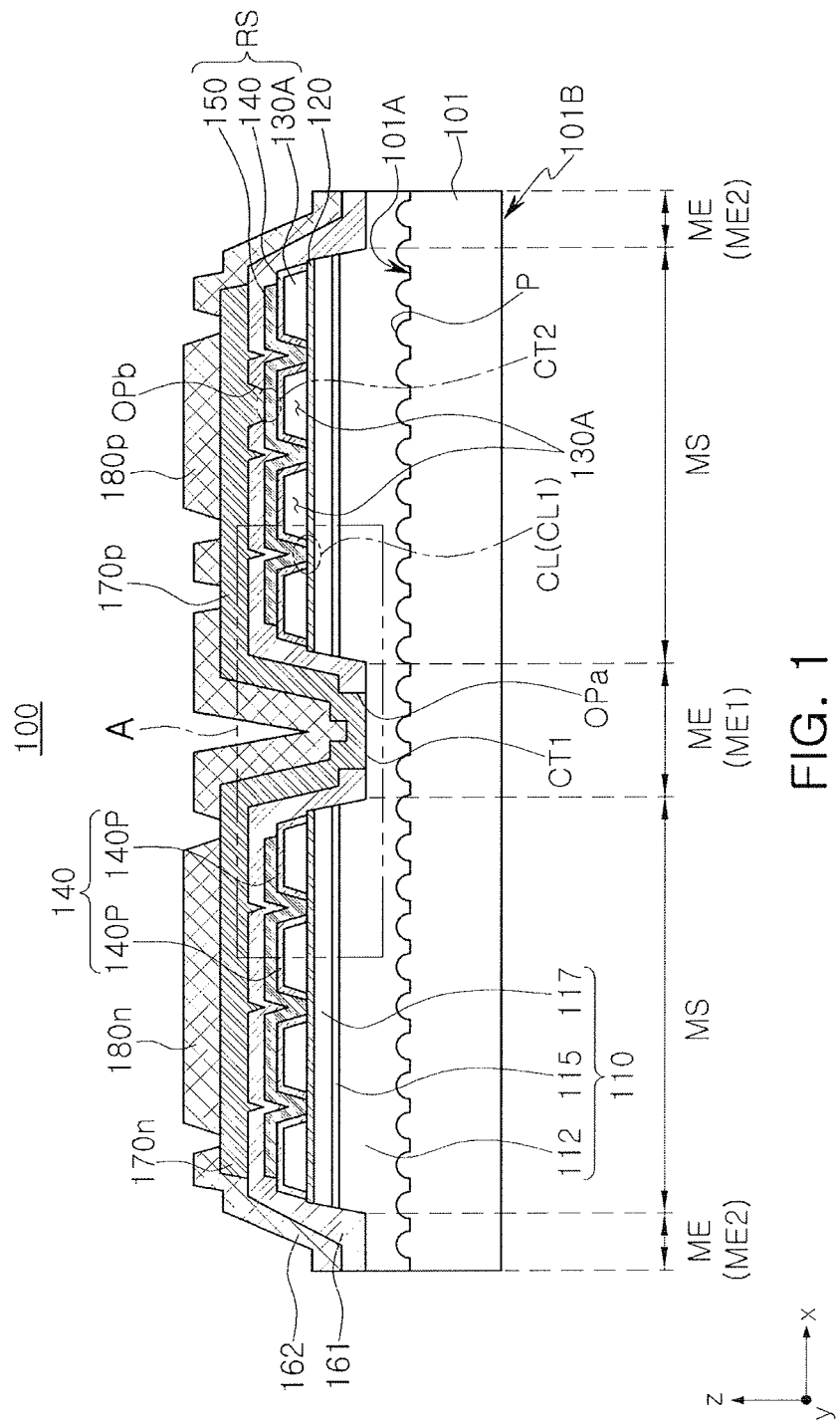
FIG. 1 illustrates a cross-sectional view of a semiconductor light emitting device according to an example embodiment.

FIG. 1 is a cross-sectional view of a semiconductor light emitting device according to an example embodiment.

Referring to FIG. 1, a semiconductor light emitting device 100 according to an example embodiment may include a substrate 101, a light emitting structure 110, a transparent electrode layer 120, and a reflective electrode structure RS. The reflective electrode structure RS employed in the example embodiment may include an air gap 130A, a light-transmitting insulating layer 140, and a reflective electrode layer 150.

In addition, the semiconductor light emitting device 100 according to the example embodiment may further include a first insulating layer 161, a first connection electrode 170n, a second connection electrode 170p, a second insulating layer 162, a first electrode pad 180n, and a second electrode pad 180p.

The substrate 101 may have a first surface 101A and a second surface 101B facing the first surface 101A. The substrate 101 may be a substrate for semiconductor growth, and may be formed using an insulating, conductive, or semiconducting material, e.g., sapphire, silicon (Si), SiC, $MgAl_2O_4$, MgO, $LiAlO_2$, $LiGaO_2$, GaN, or the like. The sapphire may be a crystal having hexagonal-rhombo (Hexa-Rhombo R3c) symmetry, while having electrical insulation characteristics, and may be used as a substrate for growth of a nitride semiconductor.

Throughout the specification, terms such as 'first surface', 'second surface' and the like, are used to distinguish relative positions in components, and example embodiments are not limited by these terms. The terms, 'first surface', 'second surface' and the like, may be used to describe components in example embodiments, by being replaced with other terms, for example, 'upper surface', 'lower surface' and the like.

The light emitting structure 110 may be disposed on the first surface 101A of the substrate 101. In an example, a concavo-convex structure P may be formed on the first surface 101A of the substrate 101, and the light emitting structure 110 may be disposed on the concavo-convex structure P.

In detail, the concave-convex structure P may improve crystalline characteristics and light extraction efficiency of semiconductor layers constituting the light emitting structure 110. In the example embodiment, the concavo-convex structure P of the first surface 101A of the substrate 101 is illustrated as having a dome-shaped convex shape, but an example embodiment thereof is not limited thereto. For example, the concavo-convex structure P may be formed to have various shapes such as a quadrangle, a triangle and the like.

In a specific example, the substrate 101 may be removed later, depending on an example embodiment. For example, the substrate 101 may be provided as a growth substrate for growth of the light emitting structure 110, and may then be removed through a separation process. The substrate 101 may be separated from the light emitting structure 110 using, e.g., laser lift off (LLO), chemical lift off (CLO), or the like.

A buffer layer may be further provided on the first surface 101A of the substrate 101. The buffer layer may be provided to reduce a lattice defect of a semiconductor layer grown on the substrate 101, and may be formed of an undoped semiconductor layer formed of nitride or the like. As the buffer layer, a layer of undoped GaN, AlN, InGaN or the like may be used. The buffer layer may be formed to have a thickness of several tens to several hundreds of angstroms at a relatively low temperature of 500° C. to 600° C. In this case, 'undoped' indicates that a semiconductor layer is not separately subjected to an impurity doping process. However, such a buffer layer is not essential and may be omitted according to an example embodiment.

The light emitting structure 110 employed in the example embodiment may include a first conductivity-type semiconductor layer 112, an active layer 115, and a second conductivity-type semiconductor layer 117. For example, as illustrated in FIG. 1, the first conductivity-type semiconductor layer 112, the active layer 115, and the second conductivity-type semiconductor layer 117 may be stacked in the stated order on the first surface 101A of the substrate 101.

The first conductivity-type semiconductor layer 112 may be formed of a semiconductor doped with an n-type impurity, or may be an n-type nitride semiconductor layer. The second conductivity-type semiconductor layer 117 may be formed of a semiconductor doped with a p-type impurity, or may be a p-type nitride semiconductor layer. For example, the first and second conductivity-type semiconductor layers 112 and 117 may be a nitride semiconductor, satisfying empirical formula $Al_xIn_yGa_{(1-x-y)}N$ (0≤x<1, 0≤y<1, 0≤x+y<1). In another example embodiment, positions of the first and second conductivity-type semiconductor layers 112 and 117 may also be reversed.

The active layer 115 may be interposed between the first and second conductivity-type semiconductor layers 112 and 117. The active layer 115 may emit light having a predetermined energy level by recombination of electrons and holes when the semiconductor light emitting device 100 operates. For example, when the first and second conductivity-type semiconductor layers 112 and 117 are nitride semiconductors, the active layer 115 may include an InGaN compound semiconductor having an energy band gap narrower than an energy band gap of GaN. In addition, the active layer 115 may be a multiple quantum well (MQW) structure in which a quantum well layer and a quantum barrier layer are alternately stacked, e.g., an InGaN/GaN structure, but an example embodiment thereof is not limited thereto. For example, the active layer 115 may have a single quantum well (SQW) structure.

The light emitting structure 110 may include a recessed region ME formed by etching, e.g., removing, portions of the second conductivity-type semiconductor layer 117, the active layer 115, and the first conductivity-type semiconductor layer 112, and a mesa region MS around the recessed region ME. For example, as illustrated in FIG. 1, remaining portions of the second conductivity-type semiconductor layer 117, the active layer 115, and the first conductivity-type semiconductor layer 112 in the mesa region MS extend above the recessed region ME. The mesa region MS may have a form gradually narrowed from a lower part to an upper part. Thus, the mesa region MS may have an inclined side surface, e.g., the mesa region MS may have a trapezoidal cross-section in a side view.

A portion of an upper surface of the recessed region ME may be defined as a first contact region CT1. In the example embodiment, the recessed region ME may be divided into a first recessed region ME1 providing the first contact region CT1, e.g., a region between two adjacent mesa region MS as viewed in FIG. 1, and second recessed regions ME2 located along the periphery of the semiconductor light emitting device 100.

As illustrated in FIG. 1, the transparent electrode layer 120 may be disposed on an upper surface of the mesa region MS, e.g., on an upper surface of the second conductivity-type semiconductor layer 117 of the light emitting structure 110. For example, the transparent electrode layer 120 may include at least one of, e.g., indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$ and $Zn_{(1-x)}Mg_xO$(Zinc Magnesium Oxide, $0≤x≤1$). A thickness of the transparent electrode layer 120 may be within the range of about 1 nm to about 5 nm, but is not limited thereto.

The reflective electrode structure RS may be disposed, e.g., directly, on the transparent electrode layer 120. The reflective electrode structure RS employed in the present embodiment may be configured to include the light-transmitting insulating layer 140 disposed on the transparent electrode layer 120, and the reflective electrode layer 150 connected to a contact region of the transparent electrode layer 120 while being disposed on the light-transmitting insulating layer 140. The reflective electrode structure RS may further be configured to have a plurality of air gaps 130A between the light-transmitting insulating layer 140 and the transparent electrode layer 120.

The reflective electrode structure RS employed in the example embodiment may operate as an omnidirectional reflector (ODR) having a low refractive index region including the air gaps 130A, the light-transmitting insulating layer 140, and the reflective electrode layer 150. In detail, the low refractive index region may include the air gap 130A having a refractive index of approximately 1 and the light-transmitting insulating layer 140 having a relatively low refractive index, e.g., a refractive index lower than a refractive index of $SiO_2$. In this structure, the total internal reflection (TIR) characteristics may be determined depending on a refractive index of the low refractive index region. As the low refractive index region has a refractive index lower than 2.4, i.e., lower than the refractive index of GaN, a critical angle may be reduced, thereby improving total internal reflection characteristics. As such, as the reflectivity by the reflective electrode structure RS may be significantly increased, extraction efficiency of light emitted from the active layer 115 may be greatly improved.

For example, the light-transmitting insulating layer 140 may include at least one of NaF, $Na_3AlF_6$, LiF, $MgF_2$, $CaF_2$ and $BaF_2$. For example, the reflective electrode layer 150 may include at least one of silver (Ag), chromium (Cr), nickel (Ni), titanium (Ti), aluminum (Al), rhodium (Rh), ruthenium (Ru), palladium (Pd), gold (Au), copper (Cu), and combinations thereof. In a specific example, the light-transmitting insulating layer 140 may include $MgF_2$, and the reflective electrode layer 150 may include Ag.

Figure 3:
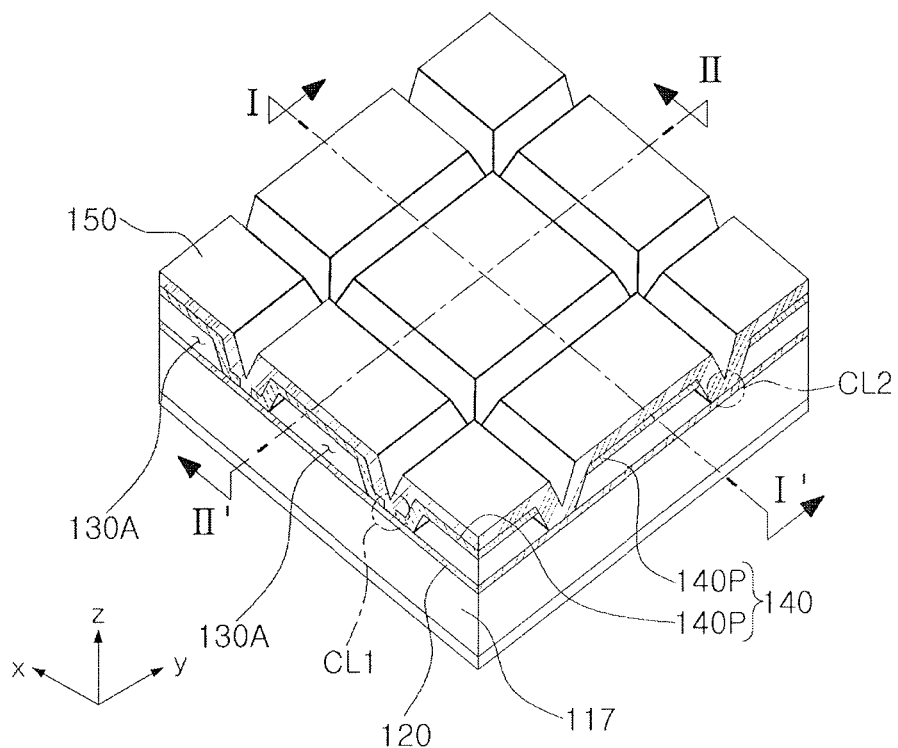
FIG. 3 illustrates a schematic perspective view of a region corresponding to portion "B" of FIG. 2.

The light-transmitting insulating layer 140 employed in the example embodiment may include a plurality of insulating patterns 140P configured to form the air gaps 130A. The plurality of insulating patterns 140P may respectively be configured to form the air gaps 130A, in such a manner that portions of sides of the air gaps 130A may be open. For example, as illustrated in FIG. 3, the plurality of insulating patterns 140P may be shaped as protrusions, e.g., arranged in two directions in a matrix pattern, on the transparent electrode layer 120, such that each protrusion may have a shape of a bridge extending over an air gap 130A on the transparent electrode layer 120, e.g., such that the matrix pattern of the bridge shaped protrusions of the insulating patterns 140P on the transparent electrode layer 120 may define or arrange the plurality of air gaps 130A along two directions into a matrix pattern. The reflective electrode layer 150 may cover the open portions of the sides of the air gap 130A, e.g., to have the air gap 130A in direct contact with the reflective electrode layer 150 (FIGS. 3 and 5). The reflective electrode structure RS having the air gaps 130A will be described in more detail later with reference to FIGS. 3 to 6.

A portion of the transparent electrode layer 120 may be exposed between the plurality of insulating patterns 140P, and an exposed region of the transparent electrode layer 120 may be provided as a contact region CL. The reflective electrode layer 150 may be electrically connected to the contact region CL of the transparent electrode layer 120.

The insulating pattern 140P employed in the example embodiment may have a plane having a quadrangular shape. A detailed structure of the reflective structure RS including the air gap 130A when the insulating pattern 140P is formed to have a quadrangular shape will be described with reference to FIGS. 2 to 6.

Figure 2:
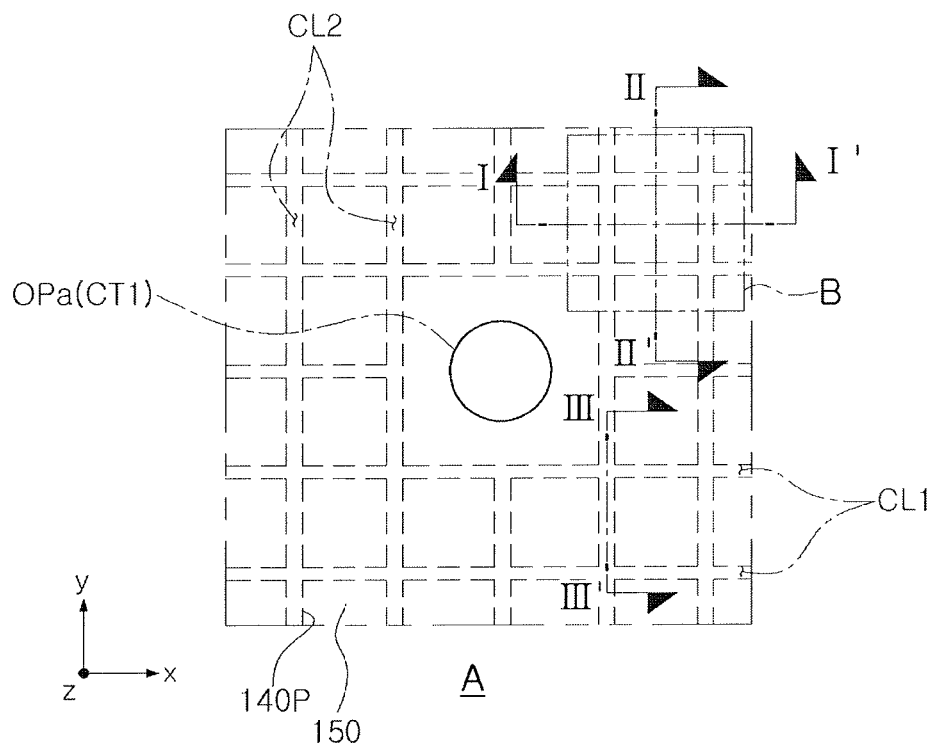
FIG. 2 illustrates a top plan view of a region corresponding to portion 'A' of FIG. 1.

FIG. 2 is a top plan view of a region corresponding to portion 'A' of FIG. 1, and FIG. 3 is a schematic perspective view of a region corresponding to portion 'B' of FIG. 2. It is noted that FIG. 2 illustrates a plane from which components located on the reflective electrode layer 150 are removed (i.e., so the reflective electrode layer 150 is illustrated as the top layer with the insulating patterns 140P illustrated therebeneath with dashed lines).

Referring to FIGS. 2 and 3, the reflective electrode layer 150 may have a quadrangular-shaped protruding form to correspond to the quadrangular-shaped insulating pattern 140P. For example, as illustrated in FIGS. 2-3, the reflective electrode layer 150 may be a continuous layer that conformally covers all the insulating patterns 140P and regions therebetween, e.g., may conformally extend along the bridge shapes of the insulating patterns 140P and may cover the open sides of the insulating patterns 140P, so the reflective electrode layer 150 may have a shape of a plurality of quadrangular protrusions connected to each other and arranged in a matrix pattern. As described above, the contact region CL of the transparent electrode layer 120 may be defined as a region between the plurality of insulating patterns 140P, e.g., where the reflective electrode layer 150 contacts an exposed portion of the transparent electrode layer 120 among the plurality of insulating patterns 140P.

As described in the example embodiment, the plurality of insulating patterns 140P may be arranged in a matrix pattern, i.e., in rows and columns, to have substantially the same quadrangular shapes as each other. For example, as illustrated in FIG. 2, the quadrangular shapes of the plurality of insulating patterns 140P may be spaced apart from each other in two directions, e.g., along the x and y directions, to define spaces therebetween in a grid pattern that corresponds to exposed portions of the transparent electrode layer 120. For example, as illustrated in FIG. 2, first and second contact regions CL1 and CL2 of the transparent electrode layer 120 may correspond to the grid pattern (i.e., spaces between the insulating patterns 140P), and may have a linear shape extending along at least two insulating patterns. In addition, the contact region CL in the example embodiment may include a plurality of first contact regions CL1 extending in a row direction, e.g., along the x direction, and a plurality of second contact regions CL2 extending in a column direction, e.g., along the y direction, and the first and second contact regions CL1 and CL2 may be formed to intersect each other.

Figure 4:
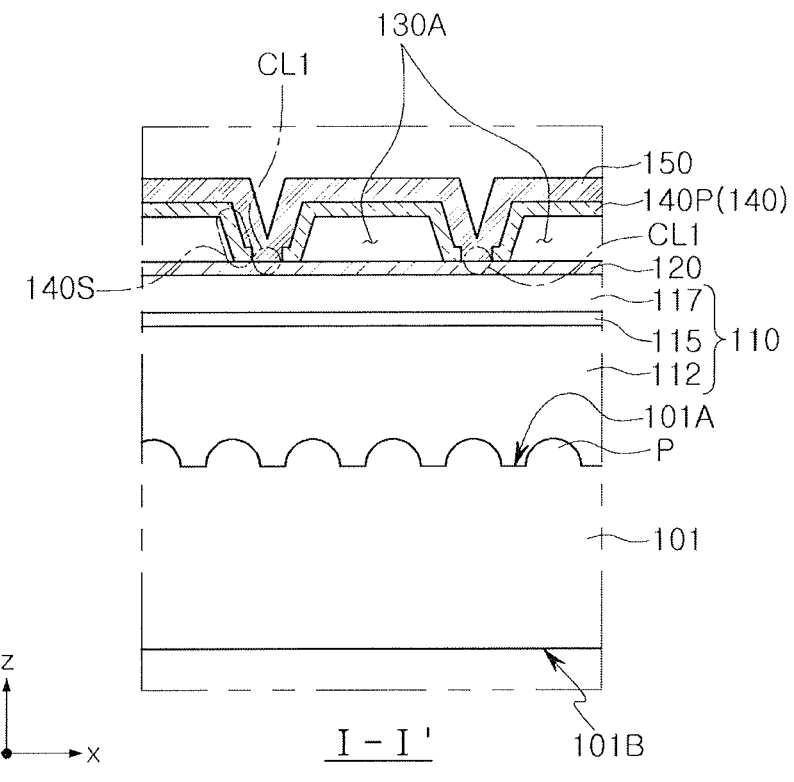
FIG. 4 illustrates a cross-sectional view taken along line I-I' of FIG. 2.
Figure 5:
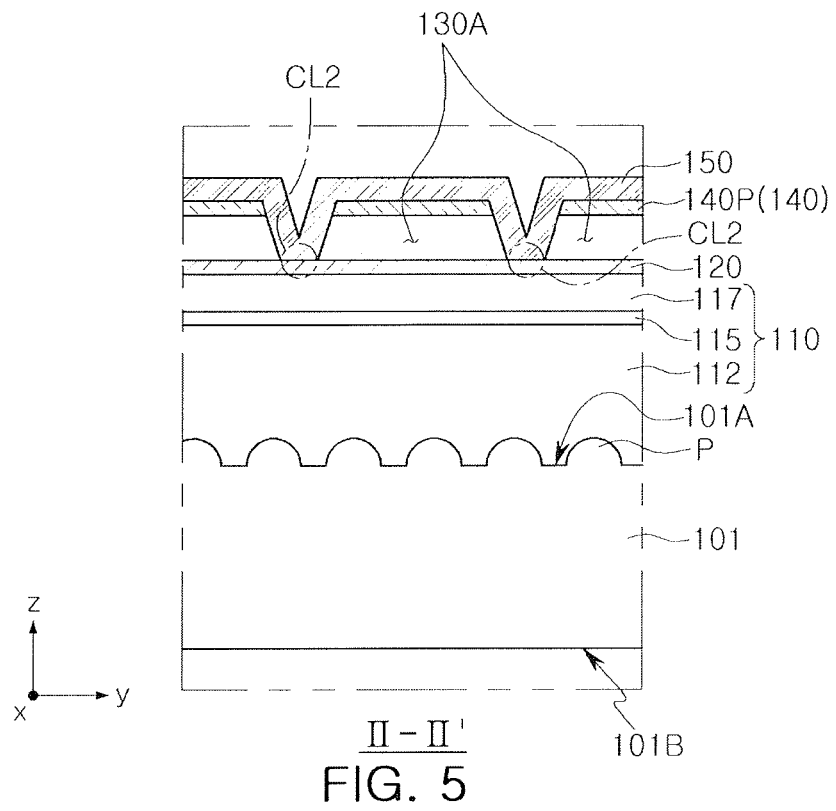
FIG. 5 illustrates a cross-sectional view taken along line II-II' of FIG. 2.
Figure 6:
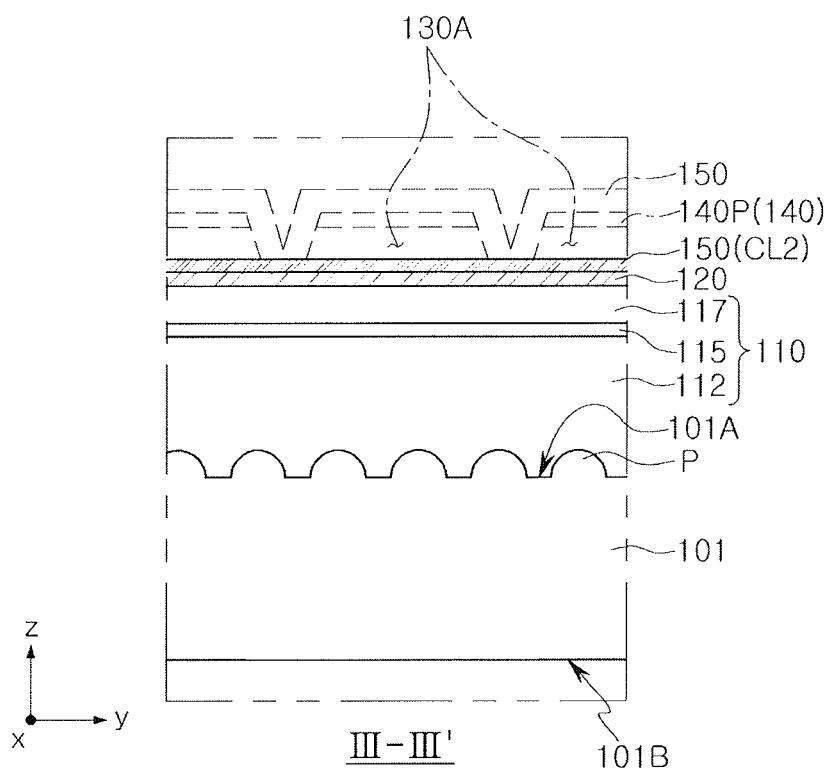
FIG. 6 illustrates a cross-sectional view taken along line III-III' of FIG. 2.

FIG. 4 is a cross-sectional view taken along line I-I' of FIG. 2, FIG. 5 is a cross-sectional view taken along line II-II' of FIG. 2, and FIG. 6 is a cross-sectional view taken along line III-III' of FIG. 2. It is noted with respect to FIG. 6, that the dashed structures illustrated above the second contact region CL2 refer to elements seen as a side view from the cross-section (e.g., the insulating pattern 140P adjacent to line III-III' along the x-direction in FIG. 2)

First, referring to FIGS. 3-5, the insulating pattern 140P employed in the example embodiment may be formed on the transparent electrode layer 120 to define the air gap 130A, while the insulating pattern 140P may be configured in such a manner that portions of sides of the air gap 130A may be open. For example, referring to FIGS. 3-5, the insulating patterns 140P may have bridge shapes arranged to be adjacent to each other along the x-direction, such that each bridge shape has a center part protruding above the transparent electrode layer 120 with two opposite ends along the x-direction that contact the transparent electrode layer 120 (FIG. 4), while opposite edges of each bridge along the y-direction are spaced apart from the transparent electrode layer 120 (FIG. 5) to define the open sides of the insulating patterns 140P. For example, the open sides of the insulating patterns 140P may be adjacent to each other along the y-direction.

The open sides of the insulating patterns 140P may be used as paths to remove a sacrificial layer for formation of the air gap 130A. The open portions of the sides of the air gap 130A not covered by the insulating pattern 140P may be positioned to face each other in one direction, e.g., in the y-direction. In this arrangement, a removal process of the sacrificial layer may be smoothly performed, as will be discussed in more detail below (see FIGS. 15A and 15B). The open portions of the sides of the air gap 130A not covered by the insulating pattern 140P may be covered with the reflective electrode layer 150.

In detail, as in the example embodiment, when the quadrangular-shaped insulating pattern 140P is employed, two opposing sides of the air gap 130A may be defined by the reflective electrode layer 150, other than by the insulating pattern 140P. As illustrated in FIG. 5, two sides of the air gap 130A, e.g., along the y-direction, may not be covered by the insulating pattern 140P, but may be covered with the reflective electrode layer 150 formed on the insulating pattern 140P.

On the other hand, referring to FIGS. 3 and 4, other sides of the air gap 130A. e.g., along the x-direction, may be covered by an extended portion 140S of the insulating pattern 140P, and the extended portion 140S may serve as a support of the insulating pattern 140P providing the air gap 130A. The other sides of the air gap 130A, e.g., along the x-direction, may be located in a direction, different from the direction of arrangement of the open sides thereof, e.g., along the y-direction. As such, since supports of the insulating pattern 140P, i.e., the extended portions 140S, are provided opposite each other along the x-direction to contact the transparent electrode layer 120, the air gap 130A may be more stably maintained.

As in the example embodiment, when the insulating pattern 140P having a quadrangular shape is employed, two opposing sides of the air gap 130A, e.g., along the x-direction, may be defined by the insulating pattern 140P, i.e., defined by the extended portion 140S that contact the transparent electrode layer 120. For example, as illustrated in FIG. 5, two opposing sides of the air gap 130A, e.g., along the x-direction, may be covered by the insulating pattern 140P.

Referring to FIGS. 3 to 5, the reflective electrode layer 150 may be formed on the insulating pattern 140P, and may be connected to the first contact region CL1 and the second contact region CL2 of the transparent electrode layer 120. As illustrated in FIG. 3, the reflective electrode layer 150 may be formed to substantially cover, e.g., overlap, the entirety of the transparent electrode layer 120 and the light-transmitting insulating layer 140. In addition, as the reflective electrode layer 150 defines two sides of the air gap 130A not defined by the insulating pattern 140P as described above, the shape of an ultimate air gap 130A may be completed.

In another aspect, the air gap 130A implemented by the quadrangular-shaped insulating pattern 140P may be described as having a substantially hexahedral structure, e.g., a prismoid with four sides. An upper surface and two opposing side surfaces of the air gap 130A having a hexahedron structure may be covered with the light-transmitting insulating layer 140, e.g., an insulating pattern, and other two opposing surfaces may be covered with the reflective electrode layer 150.

As illustrated in FIG. 6, the second contact region CL2 of the transparent electrode layer 120 may have a linear shape extending along a region between the quadrangular insulating patterns 140P, and the reflective electrode layer 150 may be connected thereto along the second contact region CL2 having a linear shape. Thus, the contact according to the example embodiment may provide a relatively wide and sufficient connection area as compared to a contact region of a dot shape, e.g., a circular shape, thereby securing a smooth current injection. Since the first contact region CL1 also has a linear shape, a contact structure similar to that of the second contact region CL2 may be secured.

As illustrated in FIG. 1, the first insulating layer 161 may be disposed on the reflective electrode layer 150 and the light emitting structure 110. The first insulating layer 161 may include a first opening OPa exposing the first contact region CT1 of the first conductivity-type semiconductor layer 112, and a second opening OPb exposing the second contact region CT2 of the reflective electrode layer 150. The first opening OPa may be located in the first recessed region ME1, and the second opening OPb may be located in the mesa region MS.

The first connection electrode 170n may be disposed on the first insulating layer 161, and may extend onto the first contact region CT1 of the first conductivity-type semiconductor layer 112 through the first opening OPa, to be electrically connected to the first the first conductivity-type semiconductor layer 112. The first connection electrode 170n may be connected to the first contact region CT1 of the first conductivity-type semiconductor layer 112.

The second connection electrode 170p may be disposed on the first insulating layer 161, and may extend onto the second contact region CT2 of the reflective electrode layer 150 through the second opening OPb, to be electrically connected to the reflective electrode layer 150. Thus, the second connection electrode 170p may be electrically connected to the second conductivity-type semiconductor layer 117 through the reflective electrode layer 150.

For example, the first connection electrode 170n and the second connection electrode 170p may include a material containing one or more of, e.g., aluminum (Al), gold (Au), tungsten (W), platinum (Pt), silicon (Si), iridium (Ir), silver (Ag), copper (Cu), nickel (Ni), titanium (Ti), chromium (Cr) and the like, and alloys thereof. The first connection electrode 170n and the second connection electrode 170p may be formed by the same deposition process.

The second insulating layer 162 may be disposed on the first insulating layer 161, in such a manner that a portion of the first connection electrode 170n and a portion of the second connection electrode 170p are exposed. The first electrode pad 180n may be disposed on a portion of the first connection electrode 170n, and the second electrode pad 180p may be disposed on a portion of the second connection electrode 170p. The first and second electrode pads 180n and 180p may be under-bump metallurgy (UBM). In an example, the number and arrangement of the first and second electrode pads 180n and 180p may be variously modified.

In addition, first and second conductive bumps may be disposed on the first and second electrode pads 180n and 180p, respectively. For example, the conductive bump may include a metal or an alloy, such as tin (Sn) or Au—Sn.

As described above, the reflective electrode structure RS employed in the example embodiment may have an ODR structure, and may include a low refractive index region having a dual layer structure and a reflective electrode layer. In this case, the dual layer structure may be composed of the air gap 130A and the light-transmitting insulating layer 140. In detail, since the air gap 130A has a refractive index of 1, the total reflection characteristics may be significantly increased, thereby increasing reflectivity. In addition, the light-transmitting insulating layer 140 having a supporting structure may include a dielectric material having a refractive index lower than that of $SiO_2$, to improve the reflectivity. A detailed reflectivity improving effect will be described in detail with reference to FIGS. 7 and 8.

The reflectivity was measured by providing reflective electrode structures with different configurations, as illustrated in Table 1 below. It can be understood that samples of the reflective electrode structures below are disposed on a p-type GaN layer and a transparent electrode layer ITO, and the same layers in respective samples were implemented to have the same thickness, e.g., the thickness of $MgF_2$ of Embodiment and the thickness of $MgF_2$ of Comparative Example 3 are equal to each other.

TABLE 1

| Classification | Embodiment | Comparative Example 1 | Comparative Example 2 | Comparative Example 3 |
| --- | --- | --- | --- | --- |
| Structure | Air/$MgF_2$/Ag | Ag | $SiO_2$/Ag | $SiO_2$/$MgF_2$/Ag |
| Reflectivity (%) | 97.1 | 95.4 | 96.5 | 96.7 |

Figure 7:
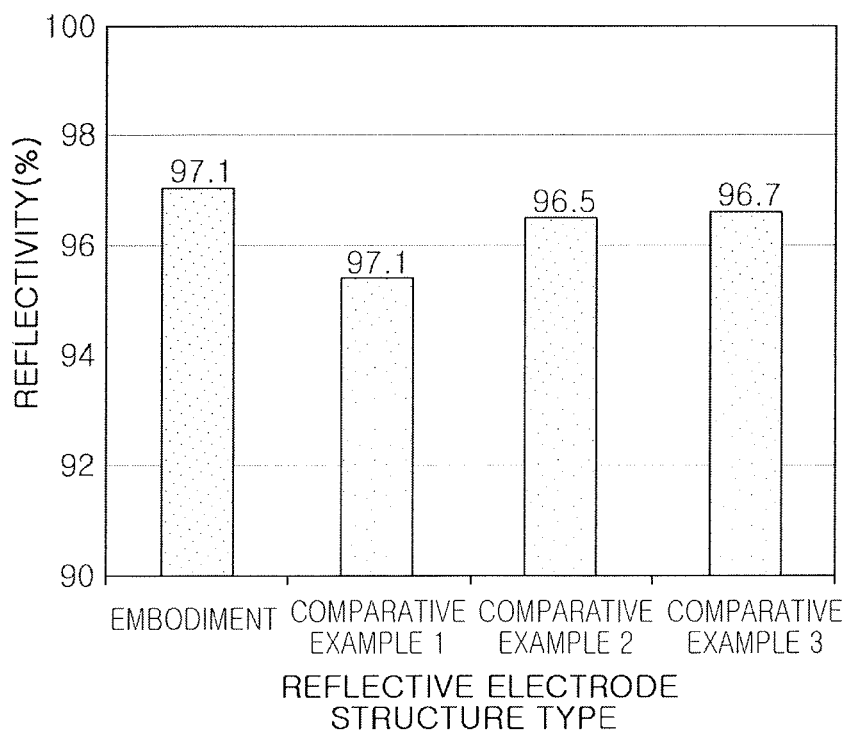
FIG. 7 illustrates a graph of reflectivity according to the structure of a reflective electrode structure.

FIG. 7 is a graph showing the reflectivity according to the structures of the reflective electrode structures.

Referring to FIG. 7, in the case of Comparative Example 1, the reflectivity of Ag was lower than the reflectivity (95.9%) of Ag due to the absorption of light by the ITO. In Comparative Examples 2 and 3 with the ODR structure, the reflectivity was 96.5% and 96.7%, respectively, as slightly improved results. In the case of the reflective structure according to the example embodiment, the highest reflectivity of 97.1% was measured. As described above, since the air gap 130A has a relatively lowest refractive index (n=1), it can be understood that total reflection characteristics are significantly increased to increase substantial reflectivity. In the reflective electrode structure (Air/$MgF_2$/Ag) of the Embodiment in Table 1 above, the reflectivity was measured with various thickness ratios, while constantly maintaining the total thickness of the air gap and the light-transmitting insulating layer ($MgF_2$) at 600 nm.

Figure 8:
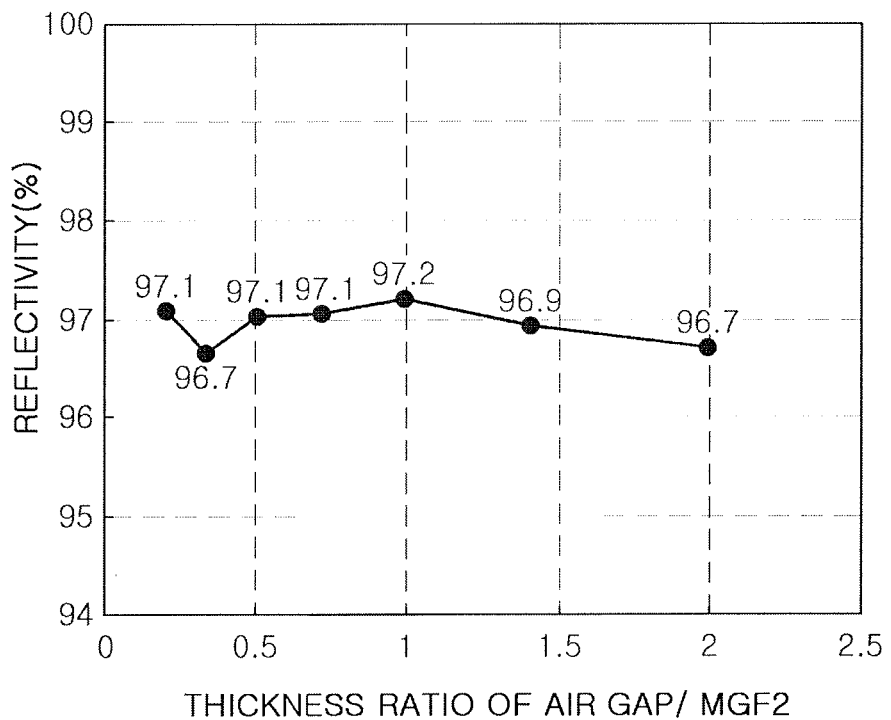
FIG. 8 illustrates a graph of reflectivity according to a change in thicknesses of an air gap and a light-transmitting insulating layer in the reflective electrode structure according to an example embodiment.

FIG. 8 is a graph showing reflectivity according to thickness variation of the air gap and the light-transmitting insulating layer in the reflective electrode structure according to the example embodiment.

Referring to FIG. 8, when a thickness ratio of the air gap to the light-transmitting insulating layer is 0.5 or more, the reflectivity is improved to 97% or more, and the reflectivity is somewhat improved as the thickness ratio is increased, and then, decreases to 97% or less after passing through approximately 1.3 range. In the example embodiment, it was confirmed that the reflective electrode structure exhibits a relatively high reflectivity when the thickness ratio of the air gap to the light-transmitting insulating layer is 0.5 to 1.3, i.e., a thickness of the air gap ranges from about 50% to about 130% of a thickness of the light-transmitting insulating layer.

Hereinafter, an example of a method of manufacturing the semiconductor light emitting device 100 according to an example embodiment will be described with reference to FIGS. 9 to 16.

Figure 10:
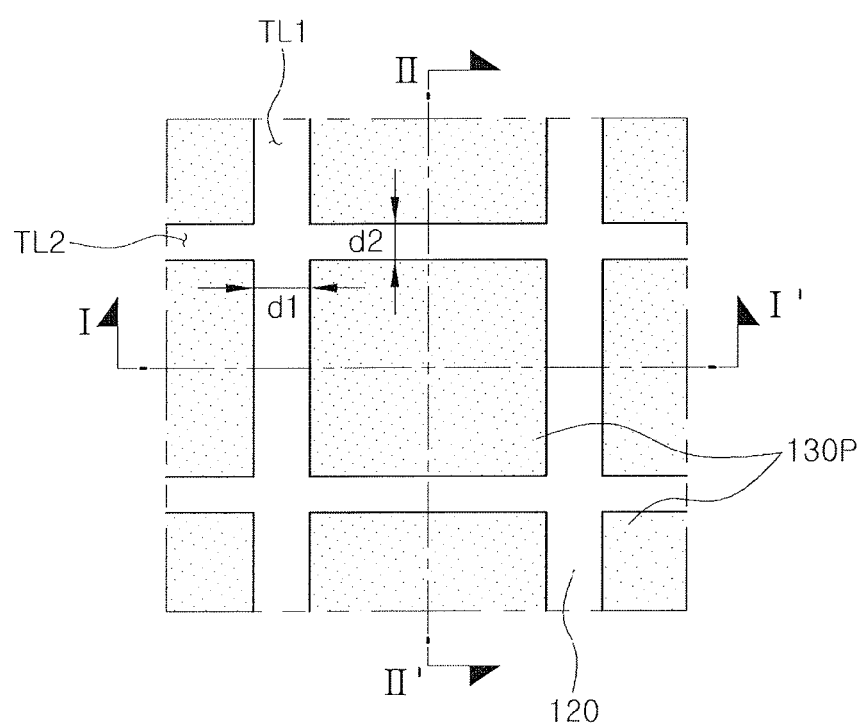
FIGS. 10, 12, and 14 illustrate top plan views of stages in a method of manufacturing a semiconductor light emitting device according to an example embodiment.
Figure 11A:
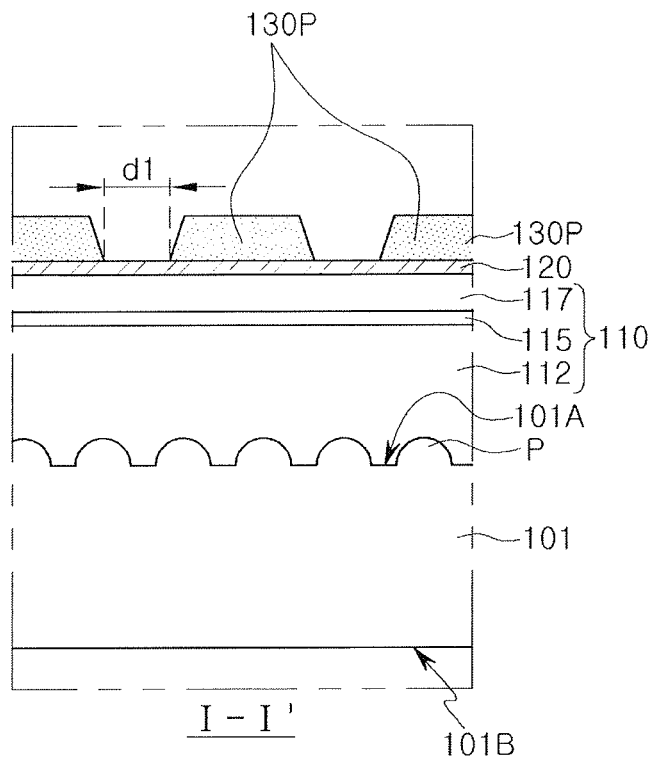
Figure 11B:
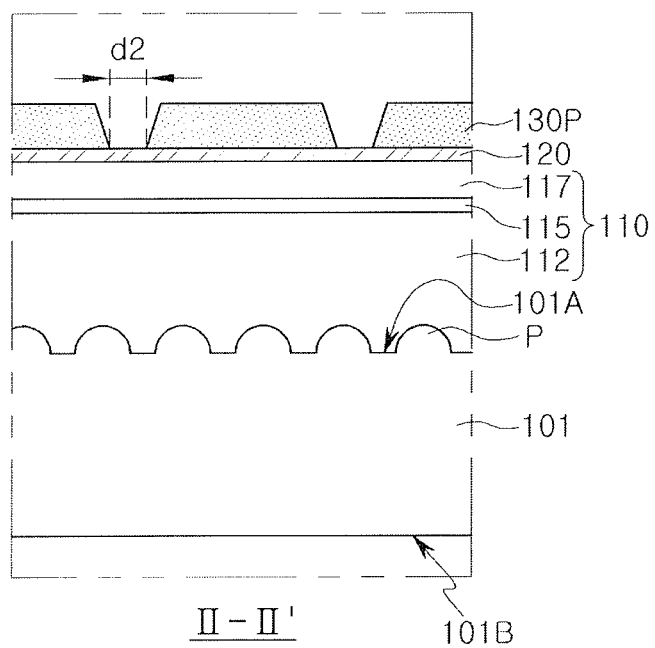
Figure 12:
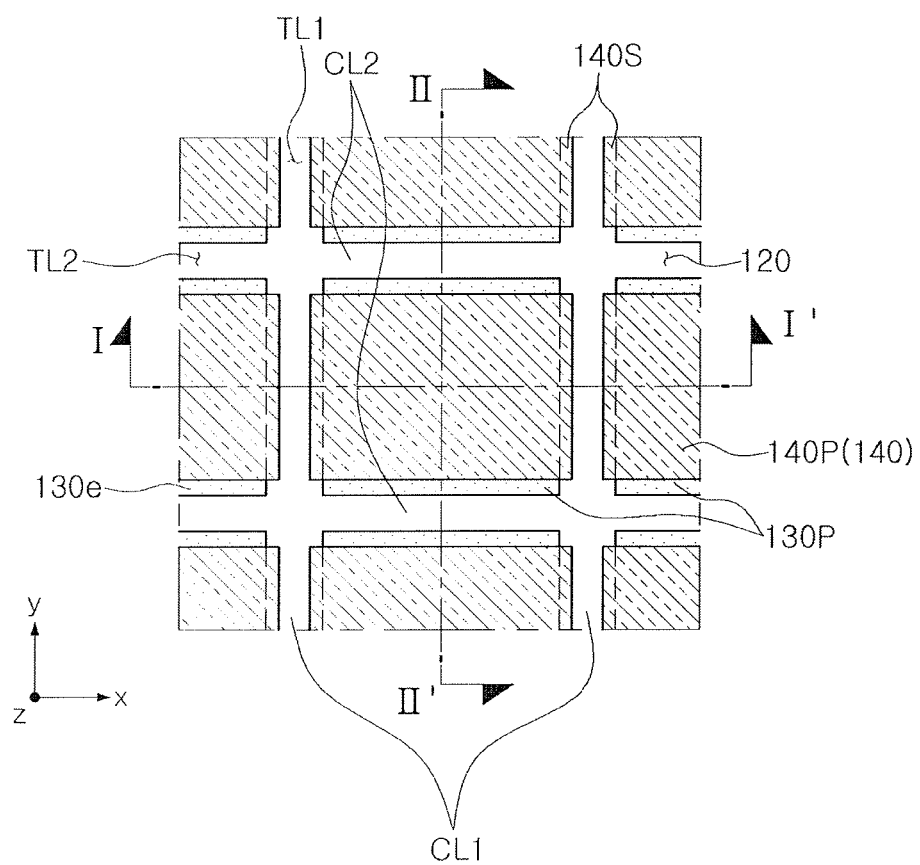
Figure 13A:
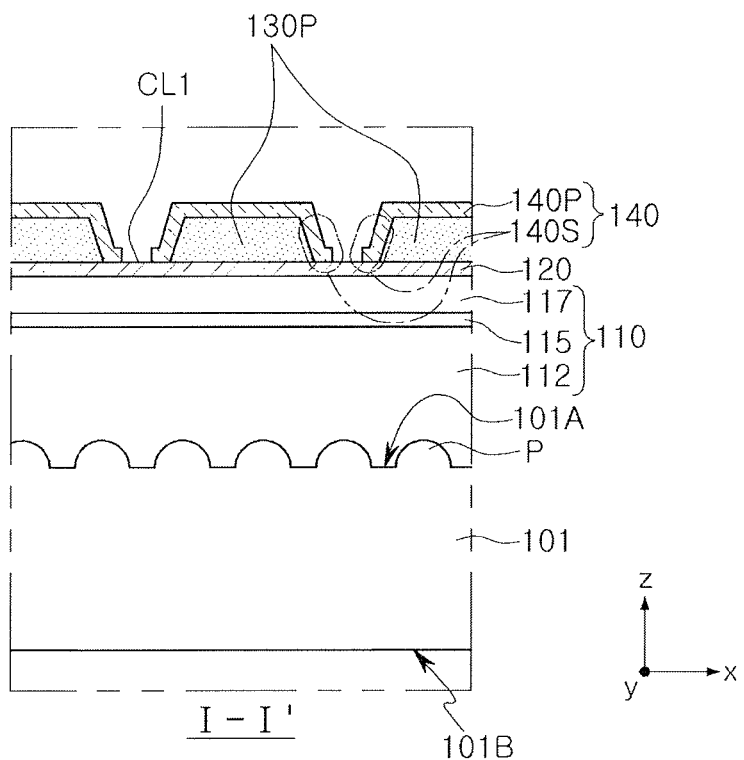
Figure 13B:
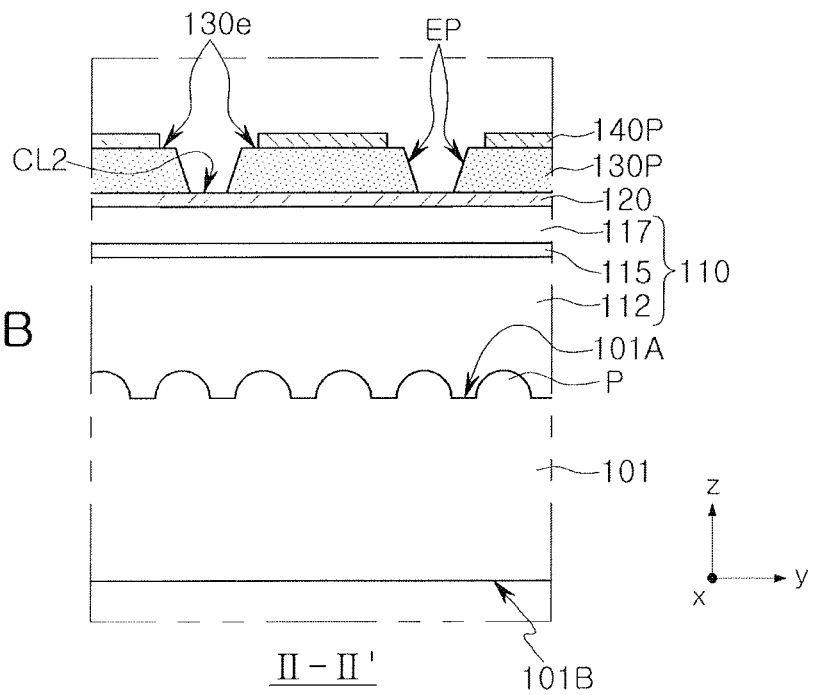
Figure 14:
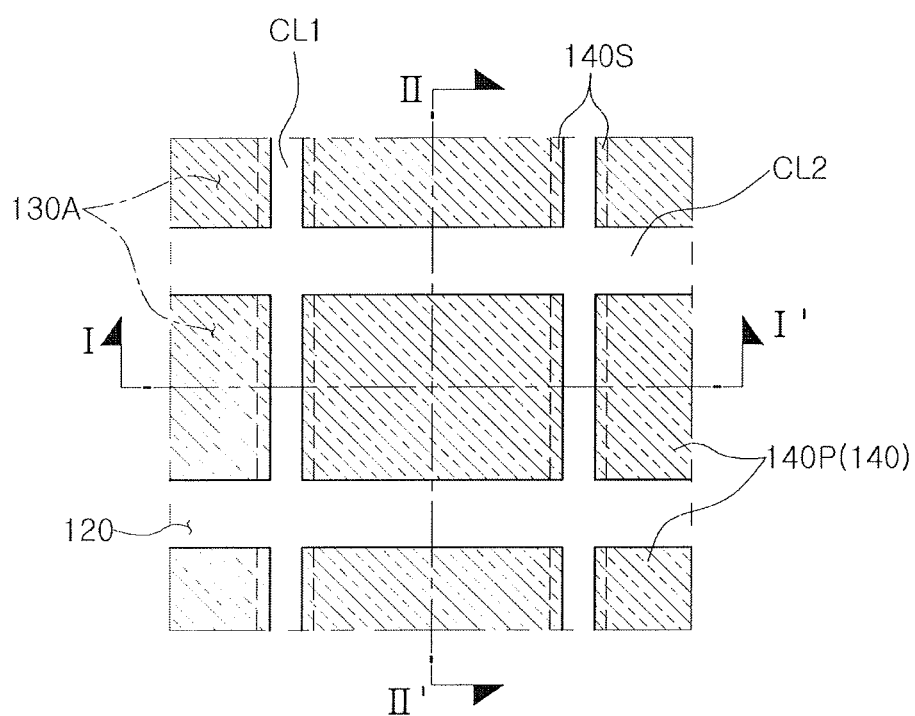
Figure 15A:
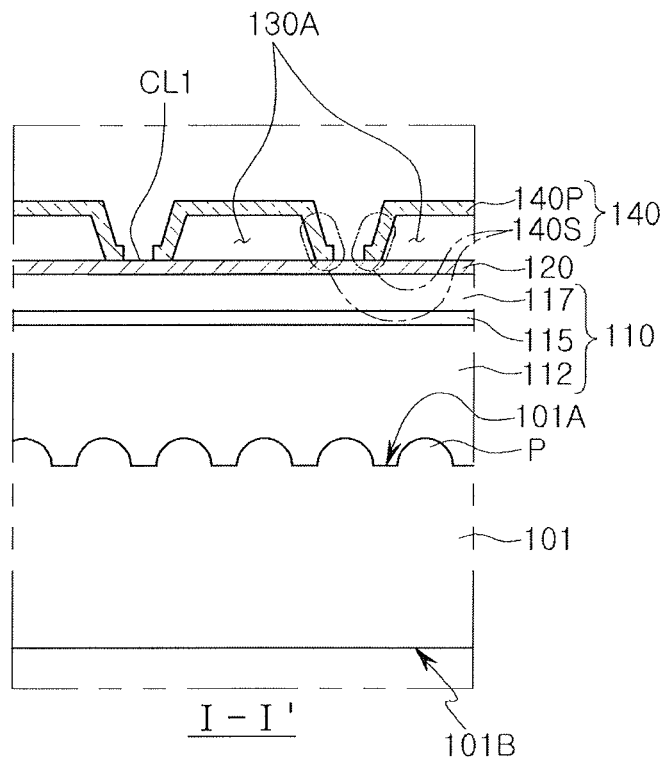
Figure 15B:
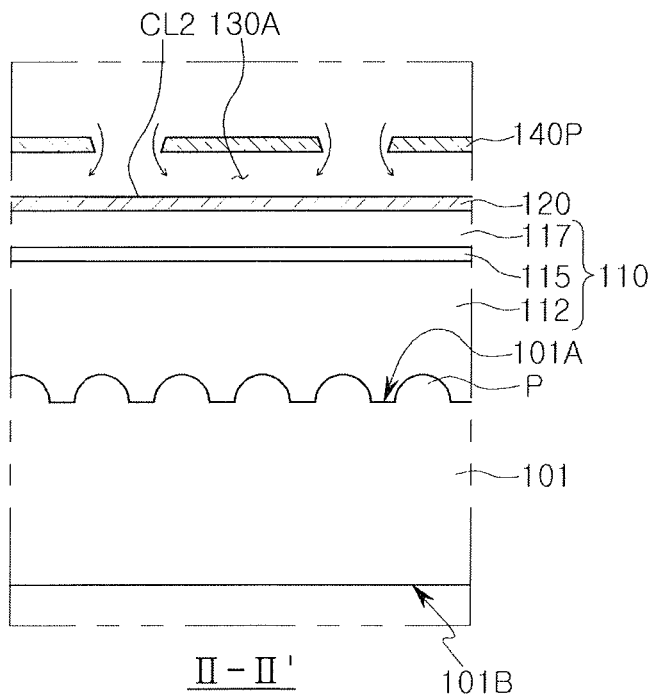
Figure 16A:
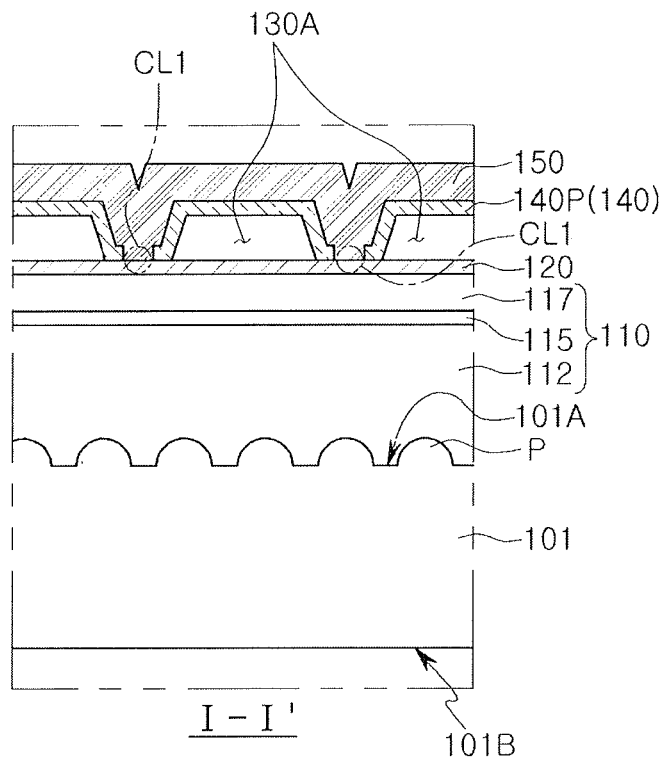
Figure 16B:
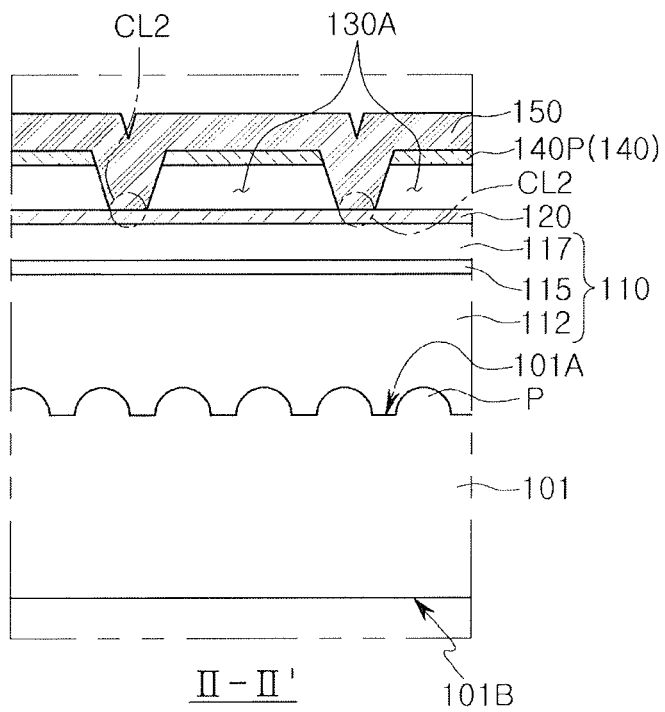

FIGS. 9, 11A, 11B, 13A, 13B. 15A, 15B, 16A and 16B are cross-sectional views illustrating stages in a method of manufacturing a semiconductor light emitting device according to an example embodiment. FIGS. 10, 12 and 14 are top plan views illustrating stages in a method of manufacturing a semiconductor light emitting device according to an example embodiment. FIGS. 11A and 11B are cross-sections along respective lines I-I' and II-II' of FIG. 10, FIGS. 13A and 13B are cross-sections along respective lines I-I' and II-II' of FIG. 12, and FIGS. 15A and 15B are cross-sections along respective lines I-I' and II-II' of FIG. 14. FIGS. 16A and 16B correspond to FIGS. 4 and 5, respectively.

Figure 9:
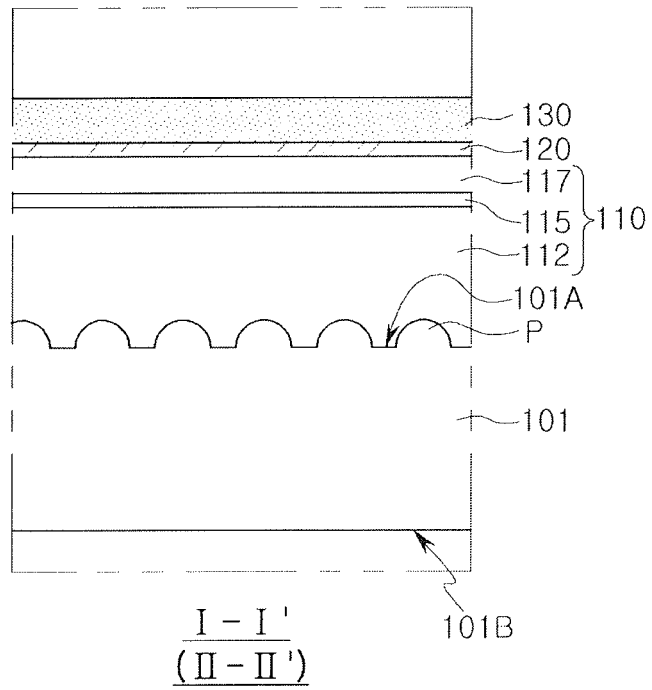
FIGS. 9, 11A and 11B, 13A and 13B, 15A and 15B, 16A and 16B illustrate cross-sectional views of stages in a method of manufacturing a semiconductor light emitting device according to an example embodiment.

Referring to FIG. 9, the light emitting structure 110 and the transparent electrode layer 120 may be formed on the substrate 101, and a sacrificial layer 130 may be formed on the transparent electrode layer. For example, the sacrificial layer 130 may cover the entire top surface of the transparent electrode layer 120.

The light emitting structure 110 may be formed by the plurality of layers 112, 115 and 117 described above, using, e.g., metal organic chemical vapor deposition (MOCVD), hydride vapor phase epitaxy (HVPE), molecular beam epitaxy (MBE) or the like. In addition, the transparent electrode layer 120 may be formed on the light emitting structure 110. The light emitting structure 110 illustrated in FIG. 9 may be the light emitting structure illustrated in FIG. 1, in which the recessed region ME is formed by etching portions of the second conductivity-type semiconductor layer 117, the active layer 115 and the first conductivity-type semiconductor layer 112, and the mesa region MS is formed around the recessed region ME.

The sacrificial layer 130 may be a temporary material layer provided to secure an air gap. The material of the sacrificial layer 130 may be a material having a relatively high etching selectivity with respect to a light-transmitting insulating layer (140 in FIG. 13) to be formed in a subsequent process. For example, the sacrificial layer 130 may be a $SiO_2$ layer, but is not limited thereto. For example, the sacrificial layer 130 may also include SiN, $TiO_2$, HfO, $NbO_2$ or $TaO_2$.

Referring to FIGS. 10, 11A, and 11B, a sacrificial pattern 130P corresponding to a required air gap may be formed by patterning the sacrificial layer 130. The patterning may be performed using a photolithography process.

In detail, the sacrificial pattern 130P having a required shape may be formed by forming first and second trench lines TL1 and TL2, e.g., portions of the sacrificial layer 130 may be removed to form the first and second trench lines TL1 and TL2 that partially expose the transparent electrode layer 120. The sacrificial pattern 130P may have a trapezoidal cross-section in a side view (FIGS. 11A-11B), and a flat quadrangular shape in atop view (FIG. 10), to have a substantially hexahedral structure, e.g., a prismoid structure as a whole. In a subsequent process, an air gap having a shape corresponding to the shape of the sacrificial pattern 130P may be formed (see FIGS. 15A and 15B).

A portion of the transparent electrode layer 120 may be exposed along the first and second trench lines TL1 and TL2, e.g., a region between the sacrificial patterns 130P. The exposed region of the transparent electrode layer 120 may be provided as a contact region contacting the reflective electrode layer 150 in a subsequent process. For example, the majority of an exposed region of the second trench line TL2 may be provided as a substantial contact region, while an exposed region of the first trench line TL1 may be partially occupied by the support of the insulating pattern (extended portion 140S of FIG. 13), and thus, a substantial contact region of the first trench line TL1 may be narrowed.

Thus, as in the example embodiment, a width d1 of the first trench line TL1 may be wider than a width d2 of the second trench line TL2 to secure a sufficient contact area in the first trench line TL1, but is not limited thereto. For example, the first and second trench lines TL1 and TL2 may also be designed to have substantially the same width.

Referring to FIGS. 12, 13A, and 13B, the plurality of insulating patterns 140P may be formed on the plurality of sacrificial patterns 130P, respectively. The process of forming the plurality of insulating patterns 140P may be performed using a photolithography process. The plurality of insulating patterns 140P may be disposed to correspond to the sacrificial patterns 130P, respectively.

In detail, as illustrated in FIG. 13A, each insulating pattern 140P may be formed to cover two opposite sides of the sacrificial pattern 130P located in one direction. The insulating pattern 140P may have the extended portion 140S extending along the two sidewalls of the sacrificial pattern 130P to be bonded to the transparent electrode layer 120. The extended portion 140S may serve as a support to maintain the air gap even after the sacrificial pattern 130P is removed.

As illustrated in FIG. 13B, respective insulating patterns 140P may be formed to expose other two sidewalls of the sacrificial patterns 130P located in different directions. For example, as illustrated in FIG. 12, while each insulating pattern 140P extends conformally along the top and two opposite sidewalls of a corresponding sacrificial pattern 130P to have a longitudinal direction along the x-direction (FIG. 13A), opposite edges and sidewalls of the sacrificial pattern 130P that are spaced apart from each other along the y-direction may not be covered by the insulating pattern 140P. The two exposed sides of the insulating patterns 140P may provide etching paths EP of the sacrificial patterns 130P, and the sacrificial patterns 130P may be effectively removed through two opposing surfaces, e.g., through the two exposed sides of the insulating patterns 140P. In addition, for effective removal of the sacrificial patterns 130P, the insulating patterns 140P may be formed in such a manner that upper corner regions 130e adjacent to the two exposed sides are partially exposed. In this process, the first contact region CL1 of the transparent electrode layer 120 may be provided between the insulating patterns 140P.

Referring to FIGS. 14, 15A, and 15B, the sacrificial patterns 130P located below the plurality of insulating patterns 140P may be removed. The removal process may be performed by a wet etching process having a selectivity ratio. Only the sacrificial patterns may be selectively removed while maintaining the plurality of insulating patterns 140P.

In detail, in the etching process, the two exposed sides of the sacrificial patterns 130P provide etching paths EP facing each other, such that the sacrificial patterns 130P may be effectively removed. The sacrificial patterns 130P may be almost completely removed to provide the air gaps 130A through the relatively large and facing etching paths EP (see FIG. 15B). Even after the air gap 130A is formed, the extended portion 140S of the insulating pattern 140P may serve as a support contacting the transparent electrode layer 120 to stably maintain the air gap 130A (see FIG. 15A). In this process, the second contact region CL2 of the transparent electrode layer 120 may be provided between the insulating patterns 140P.

Subsequently, as illustrated in FIGS. 16A and 16B, the reflective electrode layer 150 connected to the first and second contact regions CL1 and CL2 of the transparent electrode layer 120 may be formed on the plurality of insulating patterns 140P. The reflective electrode layer 150 may be formed to cover open portions of sides of the air gap 130A as shown in FIG. 16B. As described above, the two opposing sides of the air gap 130A may be defined by the reflective electrode layer 150 (see FIG. 16B), and the other two opposing sides of the air gap 130A may be defined by the insulating pattern 140P (see FIG. 16A).

Then, other components illustrated in FIG. 1, e.g., the first insulating layer 161, the first connection electrode 170n and the second connection electrode 170p, the second insulating layer 162, and the first electrode pad 180n and the second electrode pad 180p may be formed, thereby manufacturing a required semiconductor light emitting device 100.

Figure 17:
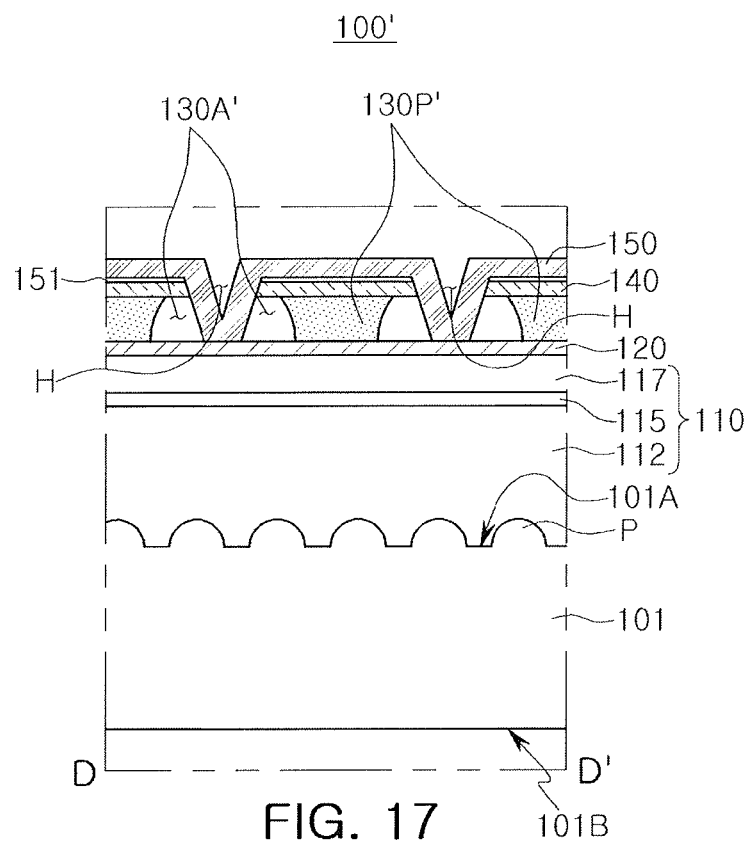
FIGS. 17 and 18 illustrate a cross-sectional view and a top plan view of a semiconductor light emitting device according to an example embodiment.
Figure 18:
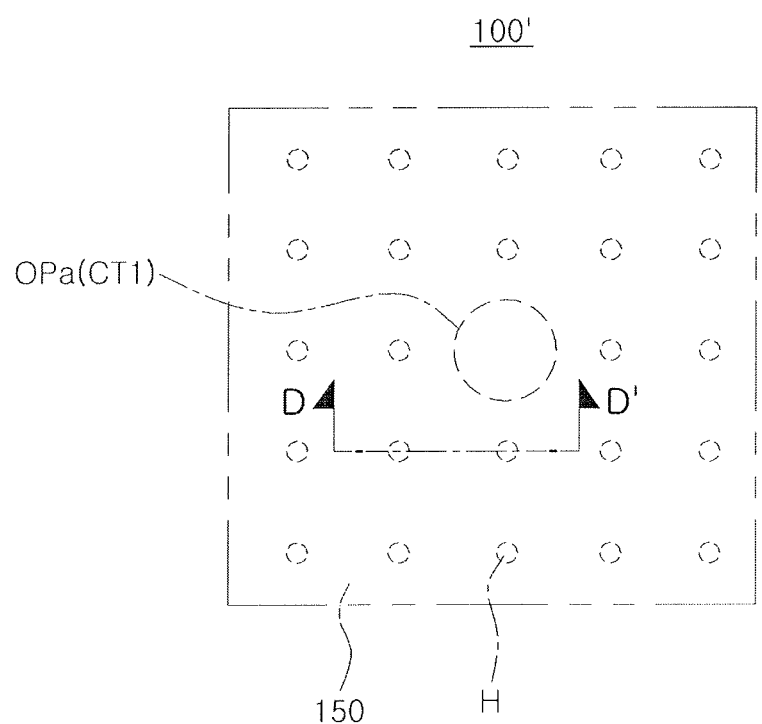

FIGS. 17 and 18 are a cross-sectional view and a top plan view, respectively, of a semiconductor light emitting device according to an example embodiment. FIG. 17 is a cross-sectional view along line D-D' of FIG. 18. Regions illustrated in a semiconductor light emitting device 100' of FIGS. 17-18 correspond to the regions shown in FIGS. 4 and 3, respectively.

Referring to FIGS. 17 and 18, except that a base insulating layer 130P' remains, which causes a change in the form of the air gap, a contact region is formed by an opening H having a hole shape, and an adhesive electrode layer 151 is introduced between the reflective electrode layer 150 and the light-transmitting insulating layer 140, descriptions of other elements are similar to those of the foregoing descriptions.

The description of the constituent elements of the example embodiment may refer to the description of the same or similar components of the semiconductor light emitting device 100 shown in FIGS. 1 to 5, unless otherwise specified. The first insulating layer 161, the first connection electrode 170n, the second connection electrode 170p, the second insulating layer 162, the first electrode pad 180n, and the second electrode pad 180p, shown in FIG. 1, are not shown in FIG. 17, but the above-described components shown in FIG. 1 may also be combined in the example embodiment, and the related description may be referred to, unless otherwise described.

Referring to FIGS. 17 and 18, the semiconductor light emitting device 100' according to the example embodiment may include the base insulating layer 130P' and the light-transmitting insulating layer 140 sequentially formed on the transparent electrode layer 120.

The base insulating layer 130P' and the light-transmitting insulating layer 140 may have a plurality of openings H connected to a contact region of the transparent electrode layer 120. The reflective electrode layer 150 may be disposed on the light-transmitting insulating layer 140, and may be connected to the contact region of the transparent electrode layer 120 through the plurality of openings H. The plurality of openings H may have a hole shape, as shown in FIG. 18, but the shape thereof is not limited thereto. For example, the plurality of openings H may have a linear shape or any other shapes.

The light-transmitting insulating layer 140 may be spaced farther apart from the plurality of openings H than the base insulating layer 130P', e.g., portions of the light-transmitting insulating layer 140 may extend toward respective openings H while overhanging corresponding portions of the base insulating layer 130P' (FIG. 17), such that the air gap 130A may be formed between the light-transmitting insulating layer 140 and the transparent electrode layer 120.

Also in the example embodiment, reflectivity may be significantly improved in at least the region in which an air gap 130A' is provided. A relatively high reflectivity may be expected as the base insulating layer 130P' and the light-transmitting insulating layer 140 are formed of different dielectric materials having a relatively low refractive index. In a specific example, the base insulating layer 130P' may include $SiO_2$, and the light-transmitting insulating layer 140 may include $MgF_2$.

The plurality of openings H may be used as a wet etching path in which a sacrificial layer (of which a remaining form is the base insulating layer 130P') is removed, while providing a contact region between the reflective electrode layer and the transparent electrode layer. In detail, the sacrificial layer is almost completely removed, but with only the opening H having a hole structure, smooth etching as in the embodiment shown in FIG. 1 may not be performed. Thus, as illustrated in FIG. 17, the air gap 130A' may only be partially formed around the opening H, and the base insulating layer 130P' may remain. The base insulating layer 130P' may serve as a structure for supporting the air gap 130A'.

A fabrication process of the reflective structure according to the example embodiment may be implemented by adding only one photolithography process, unlike the foregoing embodiment. For example, after the sacrificial layer corresponding to the base insulating layer 130P' and the light-transmitting insulating layer 140 are sequentially deposited, an opening forming process and a wet etching process may be performed at once, to form the required air gap 130A'.

Although the plurality of openings H are illustrated as being arranged in a quadrangular lattice form and having a circular cross-section by way of example, the plurality of openings H may also be arranged in a different type of arrangement, e.g., a dense hexagonal lattice, or may have other cross-sectional shapes, e.g., a polygonal, linear type, or a ring shape.

In addition, the adhesive electrode layer 151 may be disposed between the light-transmitting insulating layer 140 and the reflective electrode layer 150. The adhesive electrode layer 151 may improve adhesion characteristics between the reflective electrode layer 150 and the light-transmitting insulating layer 140. The adhesive electrode layer 151 may be formed of a material similar to that of the transparent electrode layer 120. For example, the adhesive electrode layer 151 may include ITO, ZITO, ZIO, GIO, ZTO, FTO, AZO, GZO, $In_4Sn_3O_{12}$, $Zn_{(1-x)}Mg_xO$ ($0 \le x \le 1$) or combinations thereof. Although the adhesive electrode layer 151 is illustrated as being only formed on an upper surface of the light-transmitting insulating layer 140, the adhesive electrode layer 151 may be in contact with the transparent electrode layer 120 through the plurality of openings H.

The semiconductor light emitting devices 100 and 100' described above may be manufactured in the form of packages, as products. Hereinafter, an example in which the semiconductor light emitting devices 100 and 100' according to the example embodiments are applied to a package will be described with reference to FIG. 19.

Figure 19:
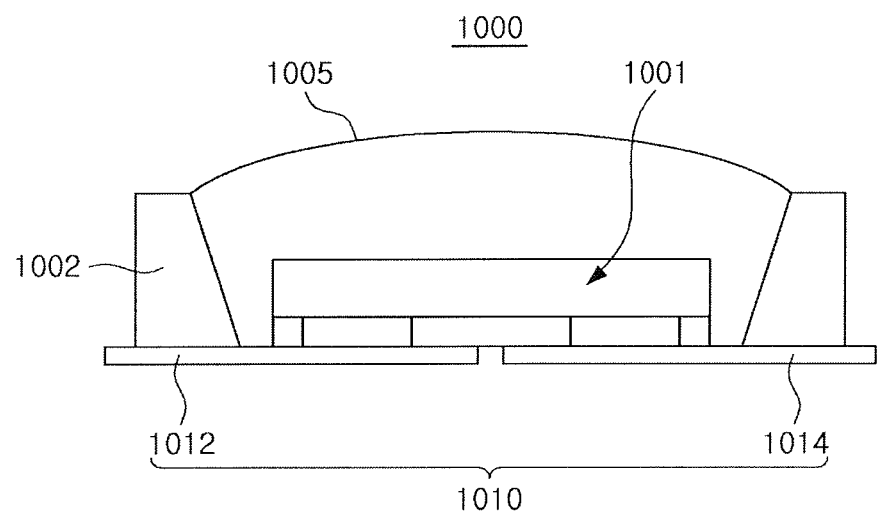
FIG. 19 illustrates a schematic cross-sectional view of a semiconductor light emitting device according to an example embodiment applied to a package.

FIG. 19 is a cross-sectional view schematically showing an example in which a semiconductor light emitting device according to an example embodiment is applied to a package.

Referring to FIG. 19, a semiconductor light emitting device package 1000 may include a semiconductor light emitting device 1001 as a light source, a package body 1002, a pair of lead frames 1010, and an encapsulation portion 1005. In this case, the semiconductor light emitting device 1001 may be the semiconductor light emitting device 100 or 100' of FIGS. 1 and 17, and a description thereof will be omitted.

The semiconductor light emitting device 1001 may be mounted on the lead frame 1010, and may be electrically connected to the lead frame 1010. The pair of lead frames 1010 may include a first lead frame 1012 and a second lead frame 1014. The semiconductor light emitting device 1001 may be connected to the first lead frame 1012 and the second lead frame 1014 by the first and second connection electrodes 170n 170p, e.g., first and second solder columns (see FIG. 1).

The package body 1002 may be provided with a reflective cup to improve light reflection efficiency and light extraction efficiency. In the reflective cup, the encapsulation portion 1005 formed of a light-transmitting material may be formed to encapsulate the semiconductor light emitting device 1001. The encapsulation portion 1005 may include a wavelength converting material, e.g., a fluorescent material, a quantum dot or the like.

By way of summation and review, example embodiments provide a semiconductor light emitting device in which light flux may be improved by increasing reflectivity of a reflective structure. That is, as set forth above, reflectivity may be improved by introducing an air gap, a low index element, into a reflective structure, an omnidirectional reflector (ODR). In an example embodiment, the air gap of the reflective structure may be expanded by exposing portions of sides of the sacrificial layer for the air gap, to remove most of the sacrificial layers. As a result, light extraction efficiency of an ultimate semiconductor light emitting device may be significantly improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a light emitting structure including a first conductivity-type semiconductor layer, an active layer, and a second conductivity-type semiconductor layer;
a transparent electrode layer on the second conductivity-type semiconductor layer; and
a reflective electrode structure on the transparent electrode layer, the reflective electrode structure including:

a light-transmitting insulating layer on the transparent electrode layer and including a plurality of insulating patterns, portions of sides of the plurality of insulating patterns being open, and a contact region of the transparent electrode layer being defined by a region between the plurality of insulating patterns, a plurality of air gaps between the transparent electrode layer and the plurality of insulating patterns, respectively, the plurality of air gaps extending in the open portions of the sides of the plurality of insulating patterns, and a reflective electrode layer on the plurality of insulating patterns to cover the open portions of the sides of the plurality of insulating patterns, the plurality of air gaps being in direct contact with the reflective electrode layer through the open portions of the sides of the plurality of insulating patterns, and the reflective electrode layer being connected to the contact region of the transparent electrode layer.

2. The semiconductor light emitting device as claimed in claim 1, wherein each of the plurality of insulating patterns includes:

a base portion over the transparent electrode layer, each of the plurality of air gaps being between the transparent electrode layer and a corresponding base portion, two extended portions extending from two respective first opposite ends of the base portion to contact the transparent electrode layer, the two extended portions being spaced apart from each other along a first direction, and two of the open portions of the of the plurality of insulating patterns, the two open portions being on two respective second opposite ends of the base portion to be spaced apart from each other along a second direction perpendicular to the first direction.

3. The semiconductor light emitting device as claimed in claim 1, wherein each air gap of the plurality of air gaps has a substantially hexahedral structure, an upper surface and two first opposing sides of the hexahedral structure being directly covered with the light-transmitting insulating layer, and two second opposing sides of the hexahedral structure other than the two first opposing sides being directly covered with the reflective electrode layer.

4. The semiconductor light emitting device as claimed in claim 3, wherein the contact region of the transparent electrode layer has a linear shape extending between the plurality of insulating patterns and arranged in a plurality of rows and columns.

5. The semiconductor light emitting device as claimed in claim 1, wherein a thickness of the air gap ranges from 50% to 130% of a thickness of the light-transmitting insulating layer.

6. The semiconductor light emitting device as claimed in claim 1, wherein the transparent electrode layer includes at least one of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$ and $Zn_{(1-x)}Mg_xO$ (Zinc Magnesium Oxide, $0 \leq x \leq 1$).

7. The semiconductor light emitting device as claimed in claim 1, wherein the light-transmitting insulating layer includes at least one of NaF, $Na_3AlF_6$, LiF, $MgF_2$, $CaF_2$ and $BaF_2$.

8. The semiconductor light emitting device as claimed in claim 1, wherein the reflective electrode layer includes at least one of silver (Ag), chromium (Cr), nickel (Ni), titanium (Ti), aluminum (Al), rhodium (Rh), ruthenium (Ru), palladium (Pd), gold (Au), copper (Cu) and combinations thereof.

9. The semiconductor light emitting device as claimed in claim 1, further comprising:

a first insulating layer on the reflective electrode layer, and having at least one opening connected to the reflective electrode layer; and a connection electrode on the first insulating layer, and connected to the reflective electrode layer through the at least one opening.

10. The semiconductor light emitting device as claimed in claim 1, further comprising an adhesive electrode layer between the light-transmitting insulating layer and the reflective electrode layer.

11. The semiconductor light emitting device as claimed in claim 10, wherein the adhesive electrode layer includes at least one of ITO, ZITO, ZIO, GIO, ZTO, FTO, AZO, GZO, $In_4Sn_3O_{12}$ and $Zn_{(1-x)}Mg_xO$ ($0 \leq x \leq 1$).

12. A semiconductor light emitting device, comprising:

a light emitting structure including a first conductivity-type semiconductor layer, an active layer, and a second conductivity-type semiconductor layer;

a transparent electrode layer on the second conductivity-type semiconductor layer;

a light-transmitting insulating layer including a plurality of insulating patterns on the transparent electrode layer, the plurality of insulating patterns being spaced apart from each other along two directions in a matrix pattern, and a contact region of the transparent electrode layer being defined in a region between two adjacent insulating patterns of the plurality of insulating patterns;

a plurality of air gaps between the transparent electrode layer and the plurality of insulating patterns, respectively, such that the plurality of air gaps is arranged in two directions in a matrix pattern on the transparent electrode layer;

a reflective electrode layer on the transparent electrode layer to cover the plurality of insulating patterns, and connected to the contact region of the transparent electrode layer;

a first insulating layer on the reflective electrode layer, and having at least one opening connected to the reflective electrode layer; and a connection electrode on the first insulating layer, and connected to the reflective electrode layer through the at least one opening.

13. The semiconductor light emitting device as claimed in claim 12, wherein each of the plurality of insulating patterns has a portion extending to be in contact with the transparent electrode layer, portions of sides of the plurality of insulating patterns being open, such that the plurality of air gaps directly contact the reflective electrode through the open portions of sides of the plurality of insulating patterns.

14. The semiconductor light emitting device as claimed in claim 13, wherein the portions of the sides of the plurality of insulating patterns are covered by the reflective electrode layer, such that first two opposite sides of each of the plurality of air gaps are covered by the reflective electrode layer and second two opposite sides of each of the plurality of air gaps are covered by a respective one of the plurality of insulating patterns.

15. The semiconductor light emitting device as claimed in claim 14, wherein the first two opposite sides of each of the plurality of air gaps are spaced apart from each other along a first direction, and the second two opposite sides of each of the plurality of air gaps spaced apart from each other along a second direction, different from the first direction.

16. The semiconductor light emitting device as claimed in claim 15, wherein the plurality of insulating patterns have a substantially quadrangular shape, the contact region of the transparent electrode layer having a linear shape extending between the plurality of insulating patterns and arranged in a plurality of rows and columns.

17. The semiconductor light emitting device as claimed in claim 12, wherein each of the plurality of air gaps is directly between the transparent electrode layer and a corresponding one of the plurality of insulating patterns.

18. A semiconductor light emitting device, comprising:
a light emitting structure including a first conductivity-type semiconductor layer, an active layer, and a second conductivity-type semiconductor layer;
a transparent electrode layer on the second conductivity-type semiconductor layer;
a base insulating layer and a light-transmitting insulating layer sequentially positioned on the transparent electrode layer, and having a plurality of openings connected to the transparent electrode layer; and
a reflective electrode layer on the light-transmitting insulating layer, and connected to the transparent electrode layer through the plurality of openings,
wherein portions of the light-transmitting insulating layer extend toward respective ones of the plurality of openings, while overhanging corresponding portions of the base insulating layer, such that an air gap is enclosed by the light-transmitting insulating layer, the base insulating layer, the reflective electrode layer, and the transparent electrode layer.

19. The semiconductor light emitting device as claimed in claim 18, wherein the light-transmitting insulating layer includes a material having a refractive index lower than a refractive index of the base insulating layer.

20. The semiconductor light emitting device as claimed in claim 18, wherein the plurality of openings have a hole shape or a linear shape.

* * * * *